United States Patent [19]
Lin

[11] Patent Number: 5,998,260
[45] Date of Patent: Dec. 7, 1999

[54] METHOD FOR MANUFACTURING DRAM CAPACITOR

[75] Inventor: Benjamin Szu-Min Lin, Tung Chui Chiayi, Taiwan

[73] Assignee: United Microelectronics Corp., Taipei, Taiwan

[21] Appl. No.: 09/055,685

[22] Filed: Apr. 6, 1998

[30] Foreign Application Priority Data

Jan. 14, 1998 [TW] Taiwan ................................. 87100407

[51] Int. Cl.⁶ ............................................. H01L 21/8242
[52] U.S. Cl. ......................... 438/254; 438/396; 438/397
[58] Field of Search .................... 438/239, 240, 438/253, 254, 241, 255, 256, 260, 396, 397, 398, 399, 964; 257/303, 304, 306, 309, 310

[56] References Cited

U.S. PATENT DOCUMENTS

| | | | |
|---|---|---|---|
| 5,170,233 | 12/1992 | Liu et al. ................................. | 257/308 |
| 5,384,276 | 1/1995 | Ogawa et al. ........................... | 438/254 |
| 5,656,536 | 8/1997 | Wu ......................................... | 438/397 |
| 5,677,222 | 10/1997 | Tseng ..................................... | 438/254 |
| 5,770,499 | 6/1998 | Kwok et al. ............................ | 438/253 |
| 5,789,267 | 8/1998 | Hsia et al. .............................. | 438/396 |
| 5,817,553 | 10/1998 | Stengl et al. ............................ | 438/253 |
| 5,834,357 | 11/1998 | Kang ....................................... | 438/396 |
| 5,843,822 | 12/1998 | Hsia et al. .............................. | 438/254 |
| 5,851,876 | 12/1998 | Jenq ....................................... | 438/253 |
| 5,879,987 | 3/1999 | Wang ..................................... | 438/253 |
| 5,891,772 | 4/1999 | Hsu ........................................ | 438/254 |
| 5,907,782 | 5/1999 | Wu ......................................... | 438/253 |

*Primary Examiner*—Charles Bowers
*Assistant Examiner*—Jack Chen
*Attorney, Agent, or Firm*—Thomas, Kayden, Horstemeyer & Risley

[57] ABSTRACT

A method for forming a DRAM capacitor that uses a sacrificial layer to form a gear-teeth mold for producing a storage electrode having a highly increased surface area. The mold in a sacrificial layer is formed by first depositing alternating layers of two different insulating materials on a dielectric layer, and then patterning the sacrificial layer to form an opening using a conventional method. Next, a wet etching operation is performed using an etchant having a high etching selectivity between the two insulating layers. Hence, sunken slots are formed in the insulating layers that have a higher etching rate than its adjacent insulating layers, thus obtaining a gear teeth cross-sectional profile. Finally, the mold in the sacrificial layer is used for forming the storage electrode.

37 Claims, 4 Drawing Sheets

METHOD FOR MANUFACTURING DRAM CAPACITOR

CROSS-REFERENCE TO RELATED APPLICATION

This application claims the priority benefit of Taiwan application serial no. 87100407, filed Jan. 14, 1998, the full disclosure of which is incorporated herein by reference.

BACKGROUND OF THE INVENTION

1. Field of Invention

The present invention relates to a method for manufacturing integrated circuits. More particularly, the present invention relates to a method of fabricating dynamic random access memory (DRAM) capacitor that utilizes the difference in etching rate between two types of material for the same etchant.

2. Description of Related Art

As the microprocessor of a computer becomes more powerful, the amount of software programs that can be run inside a computer increase exponentially. Consequently, the amount of memory space necessary for storing data must also be increased, and high efficient memory capacitors are in great demand. As the level of integration of DRAMs increases, DRAM cells are now constructed from just one transfer field effect transistor and a storage capacitor. FIG. 1 is an equivalent circuit diagram of a DRAM cell. A DRAM is normally constructed from an array of these cells. A binary bit is stored in the capacitor C of each cell. In general, when the capacitor C is uncharged, a logic state of "0" is defined. On the other hand, when the capacitor C is fully charged, a logic state of "1" is defined. A capacitor C has an upper electrode (cell electrode) 100 and a lower electrode (storage electrode) 101 with a layer of dielectric 102 sandwiched between the two to provide the necessary dielectric constant. In addition, the capacitor C is coupled to a bit line (BL), and reading and writing to and from the DRAM memory is achieved by charging or discharging the capacitor C. Charging and discharging of the capacitor is carried out through the control of a transfer field effect transistor (TFET). The source terminal of the transfer transistor is connected to the bit line BL while the drain terminal of the transfer transistor is connected to the capacitor C. The transfer transistor is switched on or off through a selection signal coming from a word line WL, which is connected to the gate terminal of the transfer transistor. Hence, whether the capacitor C is connected to the bit line allowing for charging or discharging of the capacitor depends upon the selection signal passed to the gate terminal.

A conventional DRAM having storage capacity smaller than one megabits (Mbits) has two-dimensional capacitors, commonly referred to as a planar type of capacitor. However, a planar type capacitor occupies lots of substrate area, and so is unsuitable for high level integration. Highly integrated DRAM circuits, for example, those having a storage capacity larger than about four Mbits, need three-dimensional capacitors. Three-dimensional capacitor constructs include the stacked type and the trench type.

Compared with a planar type of capacitor, a stacked type or a trench type of capacitor is able to provide the same capacitance to a capacitor despite a dimensional reduction. However, when the scale of integration for memory devices is further increased, for example, DRAM memory that can store up to 64 Mbits, even a simple three-dimensional capacitor construct is not enough.

One method of further increasing the surface area of the lower electrode, hence increasing the capacitance of a capacitor, is to develop horizontal extensions and then stacking them one over the other as in a fin-type of stacked capacitor. Description of this type of design appears in an article by Ema et al. with the title "3-Dimensional Stacked Capacitor Cell for 16M and 64M DRAMs" published in International Electron Devices Meeting, pp 592–595, December 1988, or U.S. Pat. No. 5,071,783, U.S. Pat. No. 5,126,810 and U.S. Pat. No. 5,206,787.

Another method is to allow the electrode and the dielectric film of the capacitor to extend vertically up to form a vertical structure called a cylindrical stacked capacitor. Description of this type of design appears in an article by Wakamiya et al. with the title "Novel Stacked Capacitor Cell for 64 Mb DRAM" published in Symposium on VLSI Technology Digest of Technical Papers, pp 69–70, 1989, or U.S. Pat. No. 5,077,688.

Yet, in the near future, the trend for integrating more and more devices into a wafer will continue on, and the dimensions of a DRAM cell will shrink still further. As anybody familiar with the technologies may understand, shrinking of memory cell dimensions will lead to a further reduction in the capacitance of its capacitor. One consequence of this is the production of more soft errors due to an increased effect by alpha rays. Therefore, people engaged in the semiconductor industry are still searching for ways to increase the capacitance of a capacitor when the available area is reduced.

In light of the foregoing, there is a need provide an improved method of fabricating DRAM capacitor.

SUMMARY OF THE INVENTION

Accordingly, the present invention is to provide a method for manufacturing a DRAM capacitor that utilizes the difference in etching rate between two different types of material. The method in this invention is able to increase the effective surface area of a DRAM capacitor within a very small area, and is thereby able to increase the capacitance of a capacitor.

To achieve these and other advantages and in accordance with the purpose of the invention as embodied and broadly described herein, the invention provides a method for manufacturing a DRAM capacitor. The method comprises the steps of providing a substrate that has a field effect transistor already formed thereon, wherein the field effect transistor includes a source region and a gate region. A first dielectric layer and a second dielectric layer are sequentially formed over the substrate, and then the second dielectric layer is patterned to form a first opening. Thereafter, a sacrificial layer is formed over the second dielectric layer. The sacrificial layer is a stack of layers formed by alternately depositing a first insulating layer and then a second insulating layer. Subsequently, the sacrificial layer is patterned and then etched to form a second opening exposing the first opening. Then, the etching operation is continued down, following the pattern in the first opening, to form a contact opening exposing a source/drain region. Thereafter, a wet etching operation is performed. Using the etching selectivity of the etchant with respect to the first insulating layer and the second insulating layer, a gear-teeth profile is obtained on the sacrificial layer along the exposed sides of the second opening. Next, a first conductive layer is formed over the substrate. The first conductive layer covers the exposed gear-teeth and completely fills the contact opening. Moreover, the first conductive layer is electrically coupled to the exposed source/drain region. Subsequently, using the second dielectric layer as an etching stop layer, the sacrificial layer is removed to expose the first conductive layer. Then, a dielectric film layer is formed over the exposed surface of the first conductive layer. Finally, a second conductive layer is formed over the dielectric film layer to serve as a cell electrode.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
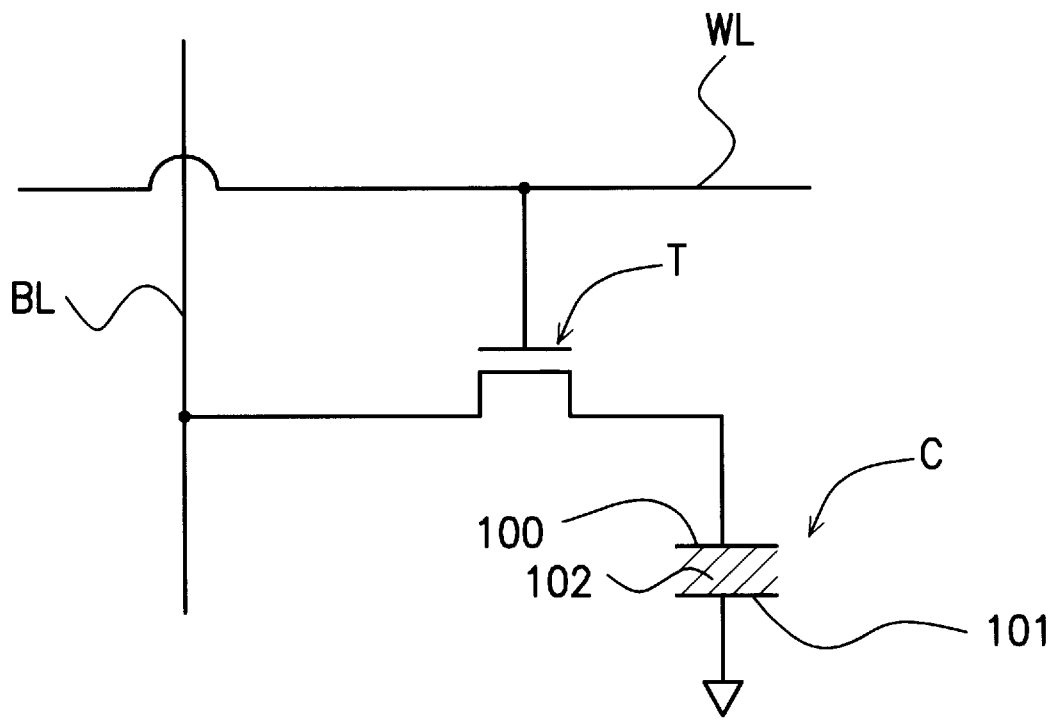
FIG. 1 is an equivalent circuit diagram for a DRAM cell.

Reference will now be made in detail to the present preferred embodiments of the invention, examples of which are illustrated in the accompanying drawings. Wherever possible, the same reference numbers are used in the drawings and the description to refer to the same or like parts.

FIG. 2A through 2F are cross-sectional views showing the progression of manufacturing steps in producing a DRAM capacitor according to one preferred embodiment of this invention.

Figure 2A:
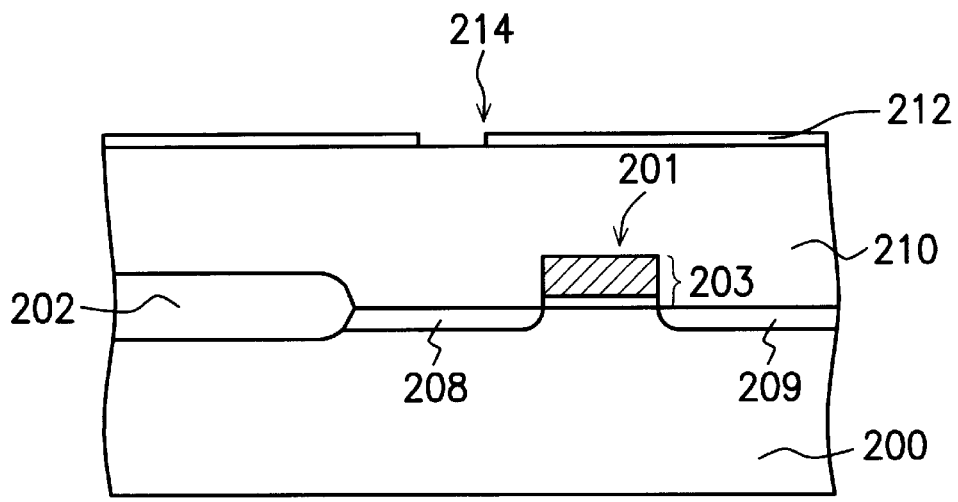
FIG. 2A through 2F are cross-sectional views showing the progression of manufacturing steps in producing a DRAM capacitor according to one preferred embodiment of this invention.

First, as shown in FIG. 2A, a DRAM field effect transistor 201 is formed over a substrate 200, for example, a P-type silicon substrate. The field effect transistor 201 having a gate structure 203 and source/drain regions 208 and 209 is formed in the active device region of the substrate 200. The active region is insulated from other active regions by a field oxide layer 202. Then, a first dielectric layer 210 and a second dielectric layer 212 are sequentially formed over the substrate 200. The first dielectric layer 210 can be a silicon oxide layer formed by a chemical vapor deposition (CVD) method, or can be a borophosphosilicate glass (BPSG) layer, for example. The second dielectric layer 212 can be a silicon nitride layer formed by chemical vapor deposition (CVD) method, for example. Thereafter, conventional photolithographic and etching processes are used to pattern the second dielectric layer 212 to form an opening 214.

Figure 2B:
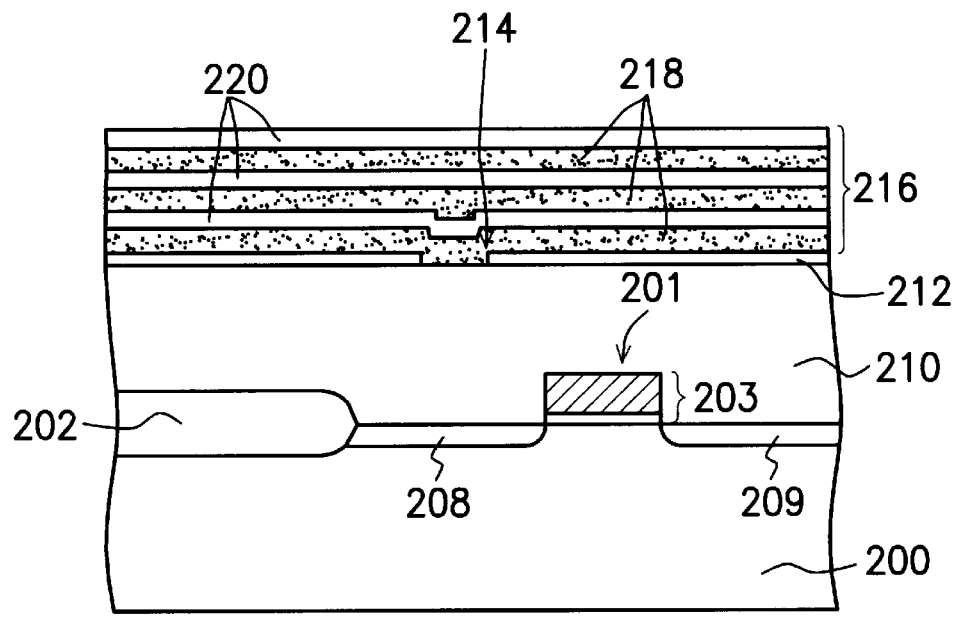

Next, as shown in FIG. 2B, a sacrificial layer is formed over the second dielectric layer 212. The sacrificial layer 216 is composed of a plurality of first insulating layers 218 and a plurality of second insulating layers 220 formed alternately one over the other. The first insulating layers 218 can be a borophosphosilicate glass (BPSG) layer formed by an atmospheric pressure chemical vapor deposition (APCVD) method, or tetra-ethyl-ortho-silicate (TEOS) silicon oxide layer formed by reacting with TEOS gas using an APCVD method, for example. The second insulating layer 220 can also be a TEOS silicon oxide layer or a borophosphosilicate glass layer, for example. However, the first insulating layer 218 and the second insulating layer 220 must be made from different materials in order to achieve the target of this invention.

Figure 2C:
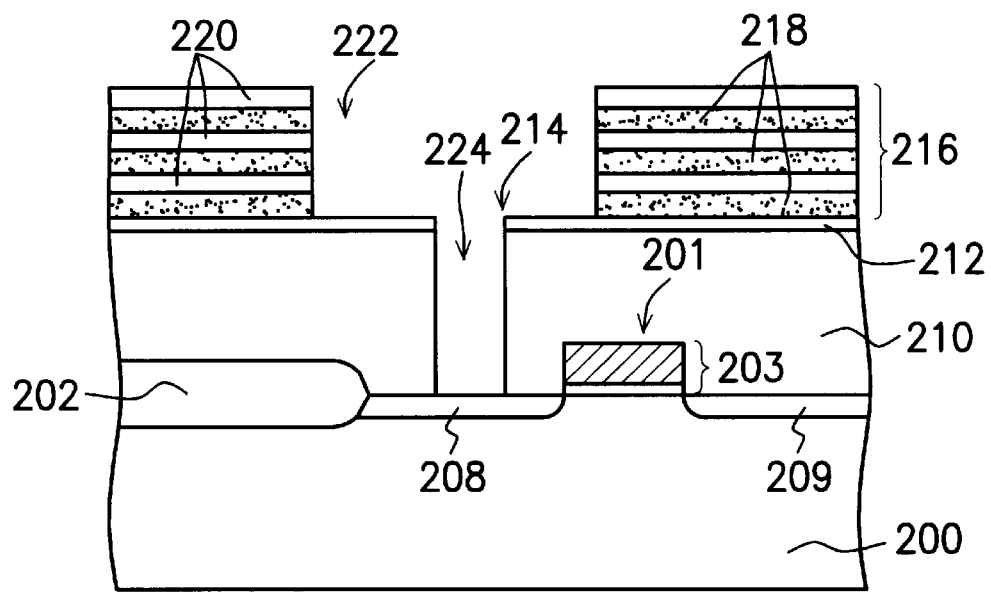

Subsequently, as shown in FIG. 2C, using the second dielectric layer 212 as an etching stop layer, conventional photolithographic and etching processes are used to pattern the sacrificial layer 216 forming an opening 222 that exposes the opening 214. At the same time, etching will continue down the first dielectric layer 210 forming a contact opening 224 that exposes a portion of the source/drain region 208. The etching rates for silicon nitride and silicon oxide are different. Therefore, when the insulating layers 218 and 220 are made from borophosphosilicate glass and TEOS silicon oxide respectively, the silicon nitride second dielectric layer 212 is able to protect the first dielectric layer 210 underneath it and preventing any damages due to the etching operation. For example, a fluoride-contained gaseous etchant can be used to perform an anisotropic etching operation. Hence, the borophosphosilicate glass first insulating layer 218 and TEOS silicon oxide second insulating layer 220 as well as the silicon oxide first dielectric layer 210 are etched to form openings 222 and 224.

Figure 2D:
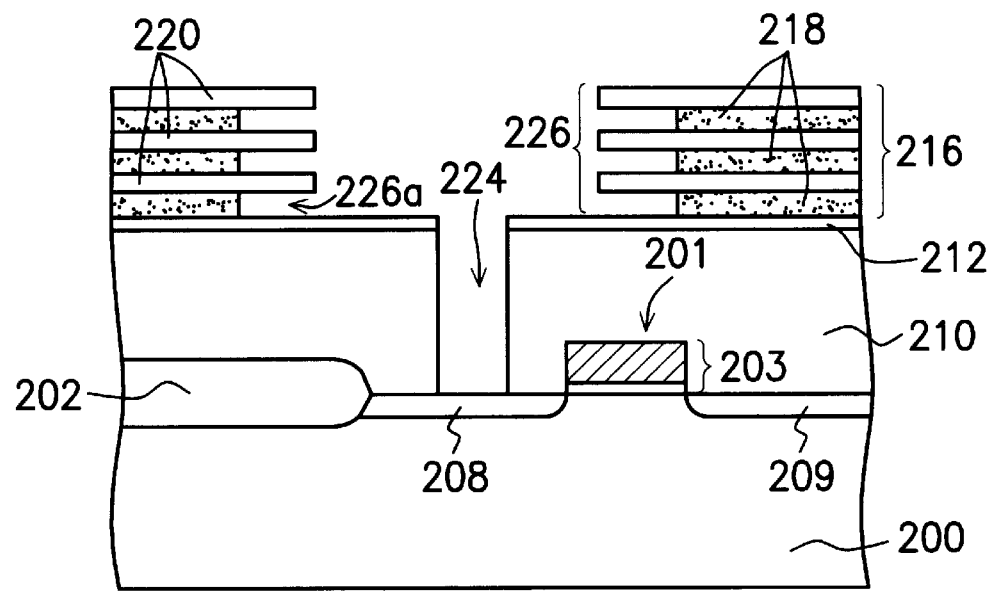

Thereafter, as shown in FIG. 2D, a wet etching operation is conducted to form a gear teeth profile 226 in sacrificial layer 216 along the sides of the exposed opening 222. A gear teeth profile 226 is obtained by etching the first insulating layer 218 and the second insulating layer 220 using an etchant that etches the first and the second insulating layers with a different rate. Thus, for example, if the etching rate for the first dielectric layer 218 is greater than the second insulating layer 220, the first dielectric layers will form sunken regions 226a of the gear teeth. On the other hand, if the etching rate for the first dielectric layer 218 is smaller than the second insulating layer 220, the first dielectric layers will form the protruded regions (not shown in the figure). Consequently, a mold for forming the storage electrode of the capacitor is formed.

Figure 2E:
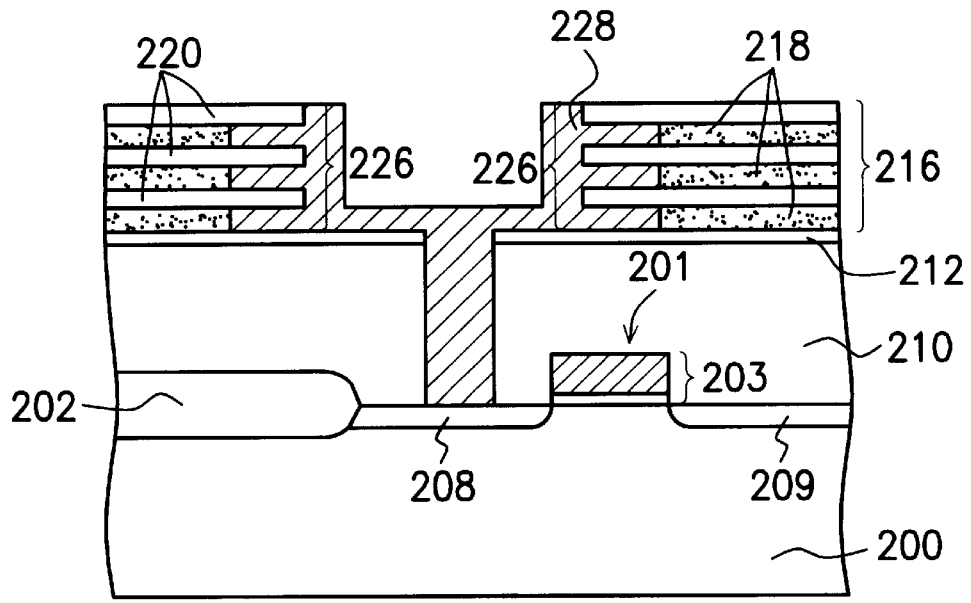

Next, as shown in FIG. 2E, a conductive layer 228 is formed over the substrate 200 filling the slots of the gear teeth in the sacrificial layer 216. Then, the conductive layer 228 is planarized using, for example, a chemical-mechanical polishing method, polishing the conductive layer 228 until the surface of the sacrificial layer is reached. The conductive layer 228 can be a doped polysilicon layer, for example. The conductive layer 228 has a structure with a concave region, and closely conforms to the opening 222 (see FIG. 2C). In order to have a better profile of the concave region, a pattern process, such as photolithography and anisotropic etching, can also be performed on the conductive layer 228 within the opening 222.

Figure 2F:
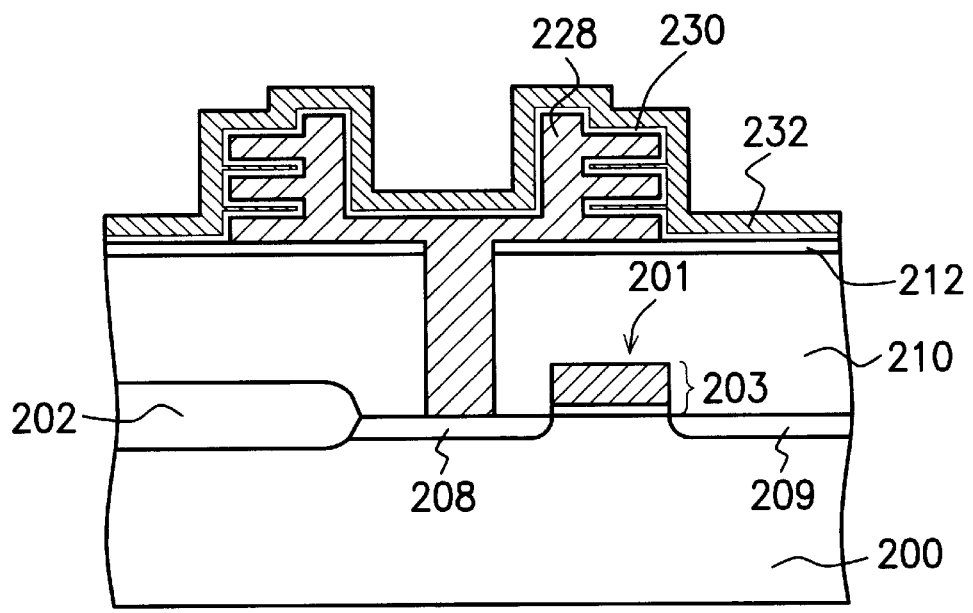

Thereafter, as shown in FIG. 2F, the sacrificial layer 216, including both the first insulating layer 218 and the second insulating layer 220, is removed. For example, using the silicon nitride layer 212 as an etching stop layer, an isotropic etching operation using a diluted hydrofluoric acid solution or a buffered oxide etchant (BOE) is carried out to remove the insulating layers 218 and 220 composed of respectively BPSG and TEOS silicon oxide. Consequently, a conductive layer 228 having a profile similar in shape to the horns of a reindeer is formed. In the subsequent step, a dielectric film preferably having a thickness of about 10 Å to 60 Å is formed over the exposed surface of the conductive layer 228. The dielectric film 230 can be a silicon oxide layer, a nitride/oxide (NO) composite layer or an oxide/nitride/oxide (ONO) composite layer. Furthermore, the dielectric film 230 can be formed from materials such as tantalum pentoxide $(Ta_2O_5)$, $Pb(Zr,Ti)O_3$ or PZT and $(Ba,Sr)TiO_3$ or BST, all of which has a very high dielectric constant. Thereafter, another conductive layer 232, for example, a metal nitride layer or a doped polysilicon layer, is formed over the exposed surface of the dielectric film 230 acting as the cell electrode of the capacitor. The conductive layer 232 can be formed by first performing a chemical vapor deposition method, and then doping with impurities such as N-type arsenic ions to increase the electrical conductivity of the deposited polysilicon layer. Alternatively, the conductive layer 232 can be formed by depositing a metal nitride layer such as titanium nitride. Finally, conventional photolithographic and etching processes are used to pattern the conductive layer 232 to form a complete storage capacitor.

The embodiment of this invention can be applied to form a capacitor over bit-line (COB) or capacitor under bit-line (CUB) type of DRAM. Subsequently, although not shown in FIG. 2F, those who are familiar with the technology may know that conventional techniques can be use to form a bonding pad, interconnects, passivation layer and packaging necessary for completing the fabrication of a DRAM integrated circuit. Since these processing steps are outside the scope of this invention, detailed description is omitted here.

In the preferred embodiment of this invention, the doped impurities of the polysilicon conductive layers 228 and 232, beside arsenic ions and phosphorus ions, can be other types of ions having a similar properties. Furthermore, the methods of doping impurities into the polysilicon layer other than the one described above can also include one of the following three types:

(1) using an ion implantation method to implant the necessary impurities with the correct concentration level into the polysilicon layer;

(2) using a chemical vapor deposition method to deposit polysilicon and at the same time doping the necessary impurities with the correct concentration level in the polysilicon layer;

(3) using a chemical vapor deposition method to deposit a layer of polysilicon, and then using a heat diffusion method to diffuse the necessary impurities into the polysilicon layer up to the desired concentration level.

As a summary, the characteristics of DRAM capacitor manufacture in this invention include:

1. The storage electrode of the capacitor is formed in a mold with a gear-teeth shaped opening. The mold itself is created from a dielectric layer and a sacrificial layer above the substrate, whereupon the sacrificial layer is removed immediately after the completion of the storage electrode.

2. The sacrificial layer is an artifact for forming a mold having a gear-teeth shaped profile. The sacrificial layer is composed of a plurality of two types of insulating layer formed alternately one over the other above the second dielectric layer 212. The sacrificial layer is patterned by a conventional method to form the opening 222, and then etched using an etchant having different etching rate with regard to the insulating layers. The sunken slots of the gear-teeth are formed resulting from the higher etching rate of the first insulating layer than the second insulating layer.

3. The cross-sectional profile of the storage electrode is similar to the horns of a reindeer. This type of profile increases the effective surface area of the capacitor, and hence increases the charge storage capacity of the DRAM capacitor considerably.

4. The fabrication process used in this invention is compatible with other conventional processes. Therefore, the procedures are easy to adopt in a production line. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a DRAM capacitor comprising:

providing a substrate having a field effect transistor formed thereon, wherein the field effect transistor includes a source/drain region;

forming a first dielectric layer and then a second dielectric layer over the substrate;

patterning the second dielectric layer to form a first opening to expose the first dielectric layer;

forming a sacrificial layer over the patterned second dielectric layer and filling the first opening, wherein the sacrificial layer is composed of a plurality of alternately stacked first insulating layers and second insulating layers;

patterning the sacrificial layer to form a second opening exposing the first opening and a portion of the second dielectric layer enclosing the first opening, and then etching the first dielectric layer through the first opening to form a contact opening exposing the source/drain region;

performing an etching operation whose etching rate on the first insulating layers and the second insulating layers is different, so that a plurality of sunken regions are formed by etching a portion of one of the first and the second insulating layers of the sacrificial layer from a vertical sidewall of the second opening, and the sunken regions form a gear-teeth cavity;

forming a first conductive layer on a sidewall of the second opening, wherein the first conductive layer also fills the gear-teeth cavity of the sacrificial layer as well as the contact opening such that the first conductive layer is electrically coupled to the exposed source/drain region;

removing the sacrificial layer to expose the first conductive layer;

forming a dielectric film over an exposed surface of the first conductive layer; and forming a second conductive layer over the dielectric film to serve as a cell electrode.

2. The method of claim 1, wherein the step of forming the first dielectric layer includes depositing silicon dioxide.

3. The method of claim 1, wherein the step of forming the first dielectric layer includes depositing borophosphosilicate glass.

4. The method of claim 1, wherein the first dielectric layer and the second dielectric layer are formed from different materials.

5. The method of claim 1, wherein the step of forming the second dielectric layer includes depositing silicon nitride.

6. The method of claim 1, wherein the patterning of the second dielectric layer includes an anisotropic etching operation.

7. The method of claim 1, wherein the first insulating layers and the second insulating layers are formed from different materials.

8. The method of claim 1, wherein the step of forming the first insulating layers include depositing borophosphosilicate glass.

9. The method of claim 1, wherein the step of forming the first insulating layers include depositing tetra-ethyl-ortho-silicate (TEOS) silicon oxide.

10. The method of claim 1, wherein the step of forming the second insulating layers include depositing borophosphosilicate glass.

11. The method of claim 1, wherein the step of forming the second insulating layers include depositing tetra-ethyl-ortho-silicate (TEOS) silicon oxide.

12. The method of claim 1, wherein the step of removing the sacrificial layer includes an isotropic etching operation.

13. The method of claim 1, wherein the step of removing the sacrificial layer includes using a solution such as a diluted hydrofluoric acid solution.

14. The method of claim 1, wherein the step of removing the sacrificial layer includes using a solution such as a buffered oxide etchant.

15. The method of claim 1, wherein the step of forming the first conductive layer and the second conductive layer includes a low-pressure chemical vapor deposition method.

16. The method of claim 1, wherein the step of forming the first conductive layer and the second conductive layer includes depositing polysilicon.

17. The method of claim 16, wherein step of forming the first conductive layer and the second conductive layer includes an impurities-doping operation.

18. The method of claim 1, wherein the step of forming the dielectric film includes depositing silicon nitride/silicon dioxide, silicon dioxide/silicon nitride/silicon dioxide, tantalum pentoxide, PZT or BST.

19. The method of claim 1, wherein the step of forming the first conductive layer comprises:

depositing a conformal conductive layer over the substrate; and performing an planarization process on the conductive layer so as to expose the sacrificial layer.

20. A method for manufacturing a DRAM capacitor, wherein a substrate has a field effect transistor formed thereon, in which the field effect transistor includes a source/drain region, the method comprising: forming a first dielectric layer and then a second dielectric layer over the substrate; patterning the second dielectric layer to form a first opening to expose the first dielectric layer; forming a sacrificial layer over the patterned second dielectric layer and filling the first opening, wherein the sacrificial layer is composed of a plurality of alternately stacked first insulating layers and second insulating layers; patterning the sacrificial layer and the first dielectric layer to form a second opening that exposes a portion of the second dielectric layer, and a contact opening that exposes the source/drain region, respectively, wherein the second opening exposes the contact opening, and the second opening is wider than the contact opening, wherein the second opening and the contact opening are continuously formed in a single etching process;

forming a sacrificial layer over the second dielectric layer, wherein the sacrificial layer is composed of a plurality of alternately stacked first insulating layers and second insulating layers;

patterning the sacrificial layer to form an opening, which is wider than the contact opening so as to expose the contact opening that exposes the source/drain region;

performing a wet etching operation whose etching rate on the first insulating layers and the second insulating layers is different, so that a plurality of sunken regions are formed due to the different etching rate on the first insulating layers and the second insulating layers, and the sunken regions form a gear-teeth cavity on a sidewall of the second opening of the sacrificial layer;

forming a first conductive layer on the sidewall of the second opening of the sacrificial layer, wherein the first conductive layer also fills the gear-teeth cavity of the sacrificial layer as well as the contact opening such that the first conductive layer is electrically coupled to the exposed source/drain region;

removing the sacrificial layer to further expose the first conductive layer;

forming a dielectric film over an exposed surface of the first conductive layer; and forming a second conductive layer over the dielectric film to serve as a cell electrode.

21. The method of claim 20, wherein the step of forming the first dielectric layer includes depositing silicon dioxide.

22. The method of claim 20, wherein the step of forming the first dielectric layer includes depositing borophosphosilicate glass.

23. The method of claim 20, wherein the first dielectric layer and the second dielectric layer are formed from different materials.

24. The method of claim 20, wherein the step of forming the second dielectric layer includes depositing silicon nitride.

25. The method of claim 20, wherein the patterning of the second dielectric layer includes an anisotropic etching operation.

26. The method of claim 20, wherein the first insulating layers and the second insulating layers are formed from different materials.

27. The method of claim 20, wherein the step of forming the first insulating layers include depositing borophosphosilicate glass.

28. The method of claim 20, wherein the step of forming the first insulating layers include depositing tetra-ethyl-ortho-silicate (TEOS) silicon oxide.

29. The method of claim 20, wherein the step of forming the second insulating layers include depositing borophosphosilicate glass.

30. The method of claim 20, wherein the step of forming the second insulating layers include depositing tetra-ethyl-ortho-silicate (TEOS) silicon oxide.

31. The method of claim 20, wherein the step of removing the sacrificial layer includes an isotropic etching operation.

32. The method of claim 20, wherein the step of removing the sacrificial layer includes using a solution such as a diluted hydrofluoric acid solution.

33. The method of claim 20, wherein the step of removing the sacrificial layer includes using a solution such as a buffered oxide etchant.

34. The method of claim 20, wherein the step of forming the first conductive layer and the second conductive layer includes a low-pressure chemical vapor deposition method.

35. The method of claim 20, wherein the step of forming the first conductive layer and the second conductive layer includes depositing polysilicon.

36. The method of claim 35, wherein step of forming the first conductive layer and the second conductive layer includes an impurities-doping operation.

37. The method of claim 21, wherein the step of forming the dielectric film includes depositing silicon nitride/silicon dioxide, silicon dioxide/silicon nitride/silicon dioxide, tantalum pentoxide, PZT or BST.

* * * * *